United States Patent [19]

Miyoshi

[11] Patent Number: 5,660,673
[45] Date of Patent: Aug. 26, 1997

[54] APPARATUS FOR DRY ETCHING

[75] Inventor: Kousuke Miyoshi, Tokyo, Japan

[73] Assignee: NEC Corporation, Tokyo, Japan

[21] Appl. No.: 475,450

[22] Filed: Aug. 17, 1994

[30] Foreign Application Priority Data

Aug. 31, 1993 [JP] Japan .................. 5-237272

[51] Int. Cl.⁶ .................................... H05H 1/00
[52] U.S. Cl. ...................... 156/345; 204/298.31
[58] Field of Search ................ 156/345; 118/723 R, 118/723 E; 204/298.34, 298.11, 298.31

[56] References Cited

U.S. PATENT DOCUMENTS 4,632,719  12/1986  Chow et al. ........................ 156/345
5,213,658   5/1993  Ishida ........................... 156/345 X

FOREIGN PATENT DOCUMENTS

| 62-128122 | 6/1987 | Japan . |
| 1-172561  | 7/1989 | Japan . |
| 3-126225  | 5/1991 | Japan . |
| 140771    | 6/1993 | Japan . |

Primary Examiner—Thi Dang
Attorney, Agent, or Firm—Young & Thompson

[57] ABSTRACT

An apparatus for dry etching includes a vacuum chamber into which an etching gas is to be introduced, an electrode disposed in the vacuum chamber, a material to be etched being placed on an upper surface of the electrode, at least one cylindrical ring disposed around the material, and a device for raising and lowering the rings so that the rings are raised above or lowered below the upper surface of the electrode.

20 Claims, 7 Drawing Sheets

FULL OPEN

PARTIAL OPEN

CLOSE

APPARATUS FOR DRY ETCHING

BACKGROUND OF THE INVENTION

1. Field of the Invention

The invention relates to an apparatus for dry etching used in semiconductor device manufacturing steps.

2. Description of the Related Art

Many apparatuses for dry etching have been proposed so far, for instance, in Japanese Unexamined Patent Public Disclosures Nos. 62-128122 published on Jun. 10, 1987, 1-172561 published on Jul. 7, 1989, and 3-126225 published on May 29, 1991. FIG. 1 schematically illustrates a typical one of such apparatuses. The illustrated apparatus for dry etching has an etching chamber 101 highly evacuated by a vacuum pump 102. In the etching chamber 101, a lower electrode 103 is disposed near a bottom surface of the chamber 101, and an upper electrode 104 is disposed above and in parallel with the lower electrode 103. To the lower electrode 103 is connected a high frequency power supply 106 through a matching box 105. To the upper electrode 104 is connected a gas introducing pipe 107. The upper electrode 104 is provided at a lower surface thereof with a plurality of openings 109 through which the gas introduced through the pipe 107 is to be blown out, and is electrically grounded.

A material to be etched, which is a semiconductor wafer W in this case, is placed on the lower electrode 103. An etching process gas is introduced into the chamber 101 through the pipe 107 and sequentially the openings 109 of the upper electrode 104, and concurrently the high frequency power supply 106 provides a high frequency voltage with the lower electrode 103, to thereby generate electric discharge in the etching process gas to form a plasma. Thus, the semiconductor wafer W is etched.

However, a conventional apparatus for dry etching such as aforementioned is often accompanied with a problem that if one or more of etching conditions vary such as an etching, pressure, a high frequency electrical power and a gas flow ratio, the uniformity of etching in the wafer tends to have a trade-off relationship with other etching properties such as a profile and selectivity.

For instance, when aluminum is to be etched with the apparatus explained with reference to FIG. 1, if a pressure is set to be high, an appropriate uniformity could be obtained, but a form would be resulted to be isotropic, whereas if a pressure is set to be low, an anisotropic profile could be obtained, but a uniformity would be deteriorated.

In view of this problem, there has been proposed an apparatus for ensuring an anisotropic etching and also enhancing the uniformity in an etched wafer. As illustrated in FIG. 2, the apparatus includes a stationary ring 108 surrounding the semiconductor wafer W placed on the lower electrode 103. The stationary ring 108 controls the discharge of gas present on the wafer W and products of reaction to thereby ensure an appropriate uniformity in etching.

However, when different kinds of layers are to be etched or when, even if the same layers are to be etched, different etching properties such as a profile and a selectivity are required because different functions are required in a semiconductor device, it is necessary to select a process gas and etching condition in accordance with the requirements. Thus, the use of the ring 108 having a fixed height is accompanied with a problem that the etching properties are not always compatible with the etching uniformity.

To solve this problem, it is necessary to use rings having an appropriate height in dependence on etching conditions or a kind of a layer to be etched. However, to use such different rings decreases the availability of the apparatus.

In addition, when laminated layers in which different kinds of layers are laminated are to be etched, a ring which is appropriate to a specific layer is not always appropriate to other layers for obtaining the desired uniformity, resulting in that an appropriate uniformity for all layers cannot be obtained.

SUMMARY OF INVENTION

It is an object of the present invention to provide an apparatus for dry etching which can ensure that the desired etching properties are compatible with the uniformity of etching even when different kinds of layers or laminated layers are to be etched.

In one aspect, the invention provides an apparatus for dry etching including a vacuum chamber into which an etching gas is to be introduced, an electrode disposed in the vacuum chamber, a material to be etched being placed on an upper surface of the electrode, a cylindrical ring disposed around the material to be etched, and a mechanism for raising and lowering the ring so that the ring is raised above or lowered below the upper surface of the electrode.

In a preferred embodiment, the mechanism for raising and lowering the ring includes support rods for supporting a central circular portion of the upper surface of the electrode, the central circular portion being defined by a circular slit through which the ring is to be raised above and lowered below the upper surface of the electrode, the material to be etched being disposed on the central circular portion, and a driver connected to a lower surface of the ring for moving the ring upward and downward, a bottom surface of the ring being provided with holes through which the support rods pass.

in another aspect, the invention provides an apparatus for dry etching including a vacuum chamber into which an etching gas is to be introduced, an electrode disposed in the vacuum chamber, a material to be etched being to be placed on an upper surface of the electrode, a smaller diameter cylindrical ring disposed around the material to be etched, a larger diameter cylindrical ring disposed around the smaller diameter cylindrical ring, and a mechanism for raising and lowering the smaller and larger diameter rings so that the rings are independently raised above or lowered below the upper surface of the electrode.

In a preferred embodiment, the mechanism for raising and lowering the smaller and larger diameter rings includes support rods for supporting a central circular portion of the upper surface of the electrode, the central circular portion being defined by a circular slit through which the smaller and larger diameter rings is to be raised above and lowered below the upper surface of the electrode, the material to be etched being disposed on the central circular potion, a first driver connected to a lower surface of the smaller diameter ring for moving the smaller diameter ring upward and downward, a bottom surface of the smaller diameter ring being provided with holes through which the support rods pass, and a second driver connected to a lower surface of the larger diameter ring for moving the larger diameter ring upward and downward, a bottom surface of the larger diameter ring being provided with holes through which the support rods pass, the first and second drivers being coaxially disposed.

In another preferred embodiment, the material to be etched is a semiconductor wafer.

In still another preferred embodiment, the smaller diameter ring is provided at a circumferential wall thereof with a plurality of openings.

In yet another preferred embodiment, the openings are equally spaced from each other.

In still yet another preferred embodiment, the openings are disposed wholly on the circumferential wall.

In further preferred embodiment, the openings are disposed in a plurality of rows along a heightwise direction of the circumferential wall.

In still further preferred embodiment, the rows of openings are equally spaced from each other.

In yet further preferred embodiment, the rows of openings are disposed wholly on the circumferential wall.

In still another aspect, the invention provides an apparatus for dry etching including a vacuum chamber into which an etching gas is to be introduced, an electrode disposed in the vacuum chamber, a material etched being to be placed on an upper surface of the electrode, a smaller diameter cylindrical ring disposed around the material to be etched, a larger diameter cylindrical ring disposed around the smaller diameter cylindrical ring, and a mechanism for rotating at least one of the smaller and larger diameter rings relative to the other, the smaller and larger diameter rings each being provided at a circumferential wall thereof with a slit, the slits being to be overlapped relative to each other when at least one of the rings is rotated relative to the other.

In a preferred embodiment, the apparatus further includes a mechanism for raising and lowering the smaller and larger diameter rings so that the rings are independently raised above or lowered below the upper surface of the electrode.

In another preferred embodiment, the mechanism for rotating at least one of the rings relative to the other includes a controller for controlling a rotating angle of the mechanism to vary an overlapping degree of the slits of the smaller and larger diameter rings.

In still another preferred embodiment, the mechanism for rotating at least one of the rings relative to the other is a step motor.

In yet another preferred embodiment, the mechanism for rotating at least one of the smaller and larger diameter rings relative to the other includes support rods for supporting a central circular portion of the upper surface of the electrode, the central circular portion being defined by a circular slit along which the smaller and larger diameter rings are to be rotated, the material to be etched being disposed on the central circular portion, and a first driver connected to a lower surface of the smaller diameter ring for rotating the smaller diameter ring, a bottom surface of the smaller diameter ring being provided with arc-shaped opening through which the support rods pass. In this embodiment, only the smaller diameter ring is rotated relative to the larger diameter ring whereas the larger diameter ring is stationary or unrotated.

In still yet another preferred embodiment, the apparatus further includes a second driver connected to a lower surface of the larger diameter ring for rotating the larger diameter ring, a bottom surface of the larger diameter ring being provided with arc-shaped openings through which the support rods pass, the second driver being disposed coaxially with the first driver. In this embodiment, both the smaller and larger diameter rings are rotated relative to each other.

In further preferred embodiment, the smaller and larger diameter rings are provided with a plurality of slits, the slits being circumferentially equally spaced from each other.

In still further preferred embodiment, the slits are disposed wholly on the circumferential wall.

In yet further preferred embodiment, the smaller and larger diameter rings are provided with a plurality of slits, the slits being disposed in a plurality of rows in a heightwise direction of the circumferential wall.

In still yet further embodiment, the slit may be shaped as a rectangle, circle or triangle.

The advantages obtained by the aforementioned present invention will be described hereinbelow.

In the apparatus for dry etching in accordance with the invention, the ring disposed around a material to be etched has a variable height. Accordingly, even when different kinds of materials are to be etched or the same kind of materials are to be etched under different conditions, it is no longer necessary to prepare a ring having an appropriate height for a desired etching.

The apparatus for dry etching in accordance with the invention may have smaller and larger diameter rings. These rings may have a variable height and/or may be rotated relative to each other to thereby vary an overlapping degree of the slits formed at the circumferential walls of the smaller and larger diameter rings. This arrangement makes it possible to adjust etching conditions to a slight degree to thereby provide an appropriate and uniform etching for various kinds of layers. In addition, this arrangement makes it easy to uniformly etch a laminated structure in which different kinds of layers are laminated.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1:
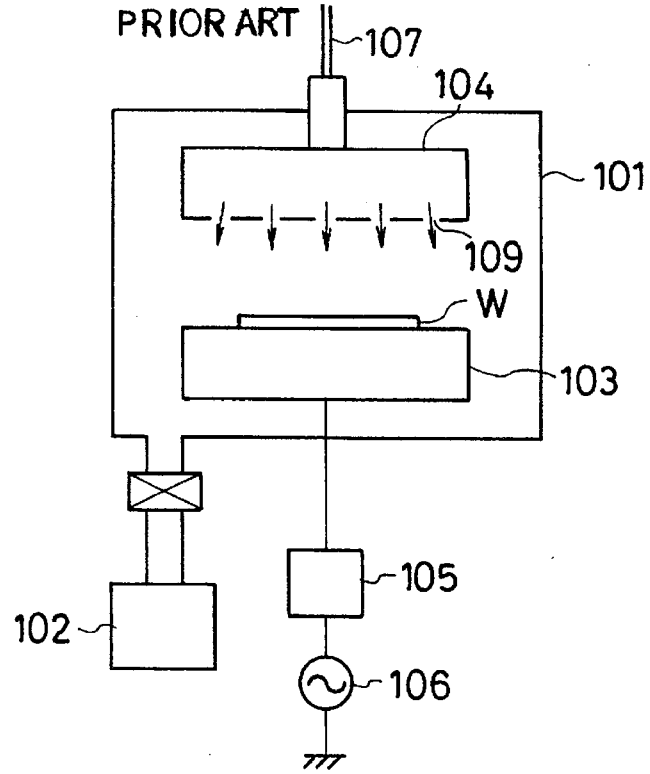
FIG. 1 is a schematic view illustrating a conventional apparatus for dry etching.
Figure 2:
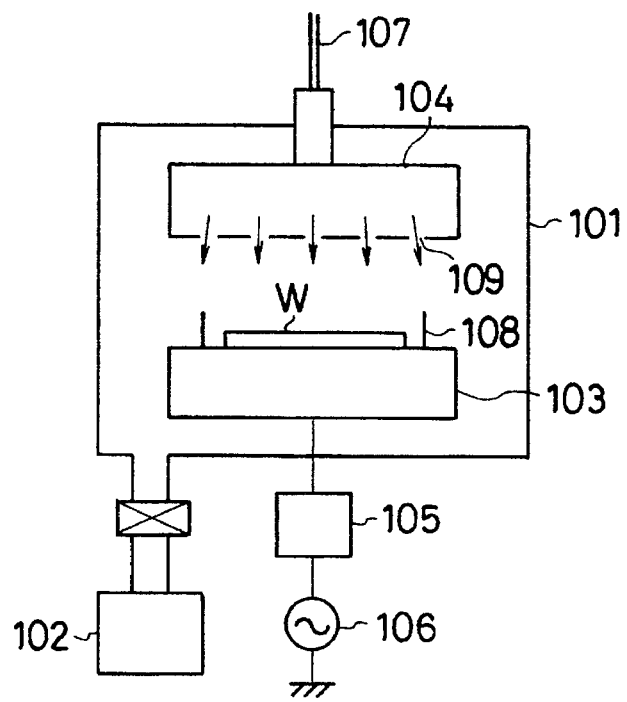
FIG. 2 is a schematic view illustrating an improvement to the apparatus illustrated in FIG. 1
Figure 3:
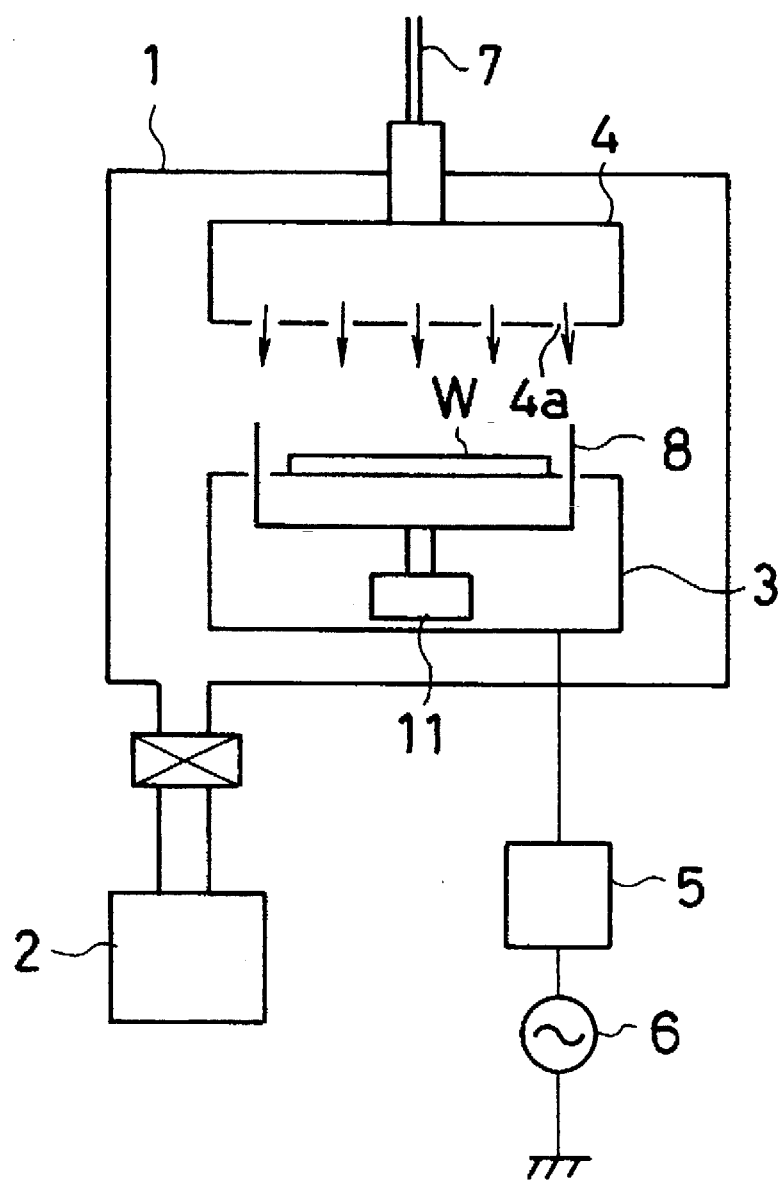
FIG. 3 is a schematic view illustrating a first embodiment of the apparatus for dry etching in accordance with the invention.

FIG. 3 illustrates a first embodiment. In an etching chamber 1 highly evacuated by a vacuum pump 2, a lower electrode 3 and an upper electrode 4 are disposed in parallel with each other. To the lower electrode 3 is connected to a high frequency power supply 6 through a matching box 5. To the upper electrode 4 is connected a gas introducing pipe 7. The upper electrode 4 is provided at a lower surface thereof with a plurality of openings 4a through which the gas introduced through the pipe 7 is to be blown out, and is electrically grounded. As will be mentioned later, a semiconductor wafer W to be etched is placed on the lower electrode 3, and a movable ring 8 surrounds the wafer W.

Figure 4A:
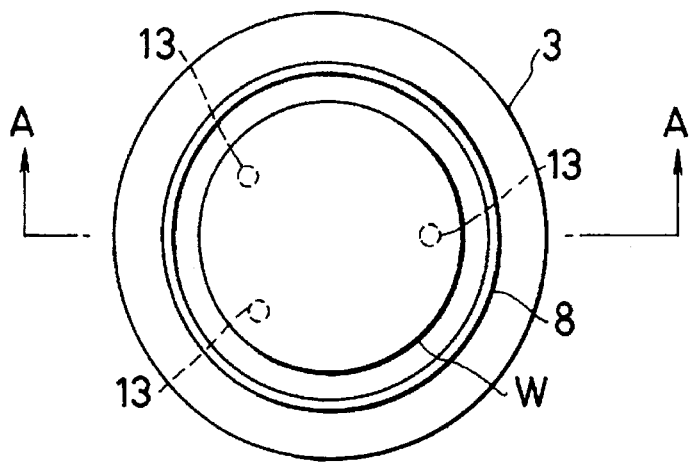
FIG. 4A is a plan view of a lower electrode used in the first embodiment.
Figure 4B:
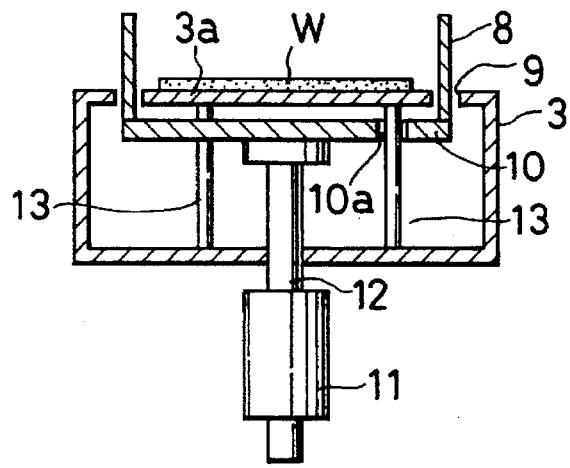
FIG. 4B is a cross-sectional view taken along the line A—A in FIG. 4A.
Figure 5A:
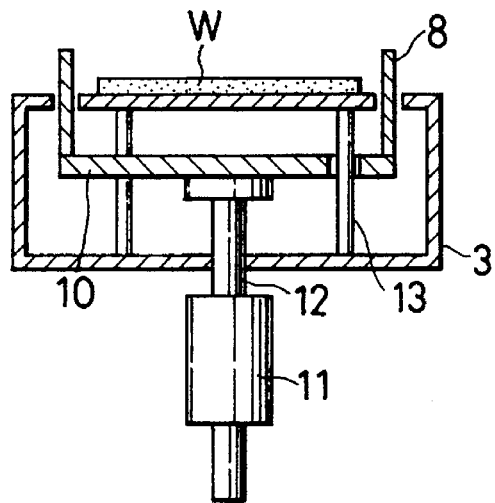
FIG. 5A is a cross-sectional view of a lower electrode and a ring being raised.
Figure 5B:
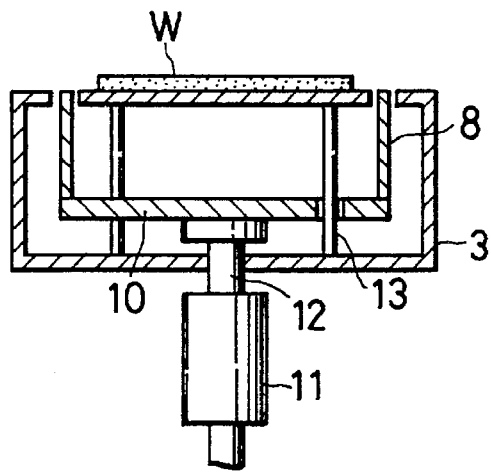
FIG. 5B is a cross-sectional view of a lower electrode and a ring being lowered.

As illustrated in FIGS. 4A and 4B, the lower electrode 3 is of a flat cylindrical shape. The upper surface of the lower electrode 3 is formed with a circular slit 9 to define a central circular portion 3a on which the semiconductor wafer W is to be placed. The cylindrical ring 8 made of quartz moves upward and downward through the slit 9. The ring 8 is integrally formed at its bottom end with a circular plate 10 to which is connected through a drive rod 12 a mechanism 11 for raising and lowering the ring 8. The mechanism 11 raises the ring 8 above the upper surface of the lower electrode 3 to a desired degree and lowered the ring 8 below the upper surface of the lower electrode 3. FIG. 5A illustrates that the ring 8 is raised to an intermediate position, and FIG. 5B illustrates that the ring 8 is lowered to a bottom position and accordingly the degree of projection of the ring 8 above the upper surface of the lower electrode 3 is zero.

The central circular portion 3a defined by the circular slit 9, on which the semiconductor wafer W is placed, is supported against the lower electrode 3 by a plurality of support rods 13 passing through the circular plate 10 through holes 10a formed therein.

The mechanism 11 for raising and lowering the ring 8 may comprise an air cylinder and a stepping motor.

The apparatus for dry etching in accordance with the first embodiment operates as follows.

After a material to be etched, which is the semiconductor wafer W in the first embodiment, is placed on the lower electrode 3, an etching process gas is introduced into the chamber 1 through the openings 4a of the upper electrode 4 and further a high frequency voltage is applied to the lower electrode 3. Thus, there is generated a discharge in the process gas to thereby generate plasma with the result that the semiconductor wafer W is etched.

While the etching is being carried out, the mechanism 11 raises the ring 8 above the upper surface of the lower electrode 3 so as to control the discharge of gas and products of reaction present on the semiconductor wafer W to thereby ensure the uniformity in etching.

Figure 6A:
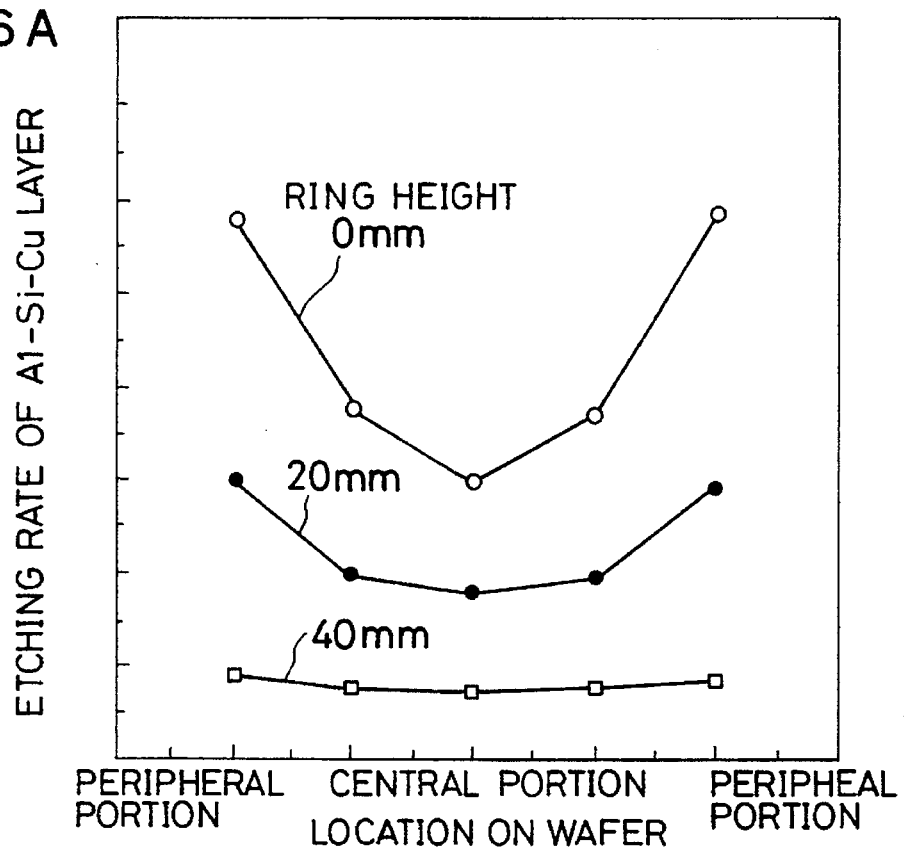
FIGS. 6A and 6B are graphs for showing the advantages obtained by the first embodiment.
Figure 6B:
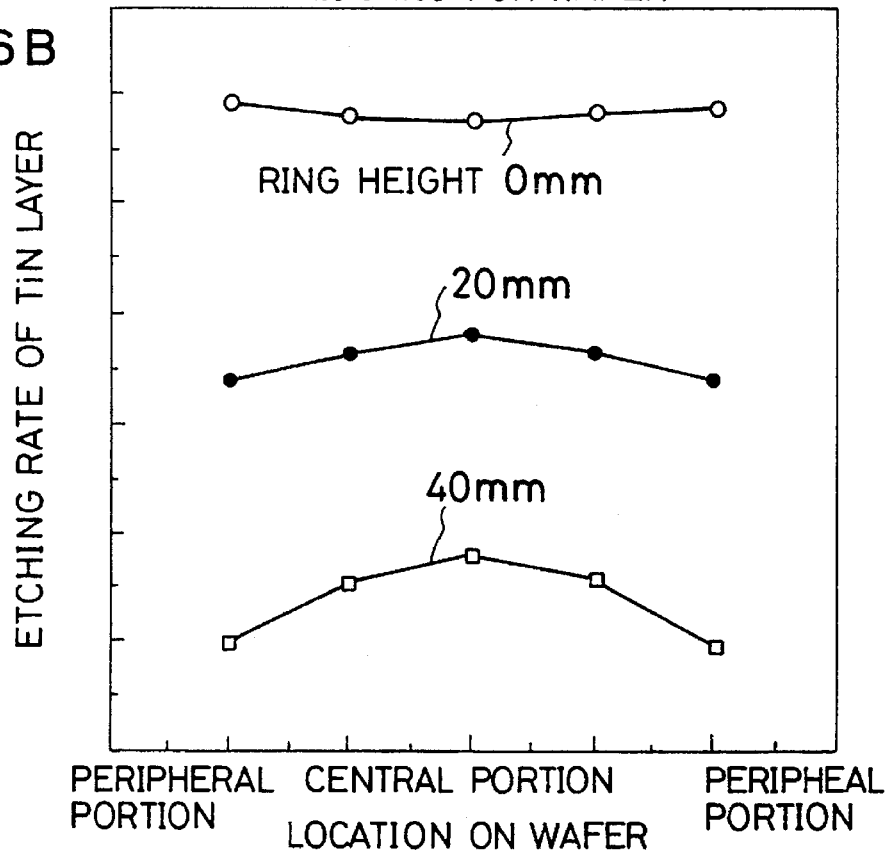

FIGS. 6A and 6B show the distribution of the etching rate of Al—Si—Cu alloy layer and TiN layer in the wafer respectively in dependence on the projecting height of the ring 8 above the upper surface of the lower electrode 3.

The etching conditions for Al—Si—Cu alloy layer are as follows.

Gas mixture ratio: $Cl_2:BCl_3:N_2=5:2:3$
Density of high frequency electrical power: 0.7 Watts/m$^2$
Pressure: 10 Pa
The etching conditions for TiN layer are as follows.
Gas mixture ratio: $Cl_2:BCl_3=5:5$
Density of high frequency electrical power: 0.4 Watts/cm$^2$
Pressure: 20 Pa As can be understood from FIG. 6A, with respect to the Al—Si—Cu alloy layer, when the projecting height of the ring 8 is zero or when the ring 8 is not projected above the upper surface of the lower electrode 3, the etching rate in the peripheral portion of the wafer W is higher than the etching rate in the central portion of the wafer W. However, in proportion to the projecting height of the ring 8 above the upper surface of the lower electrode 3, the etching rate of the periphery portion of the semiconductor wafer W is lowered. When the projecting height of the ring 8 reaches about 40 millimeters, substantially uniform etching rate can be obtained.

To the contrary, as can be understood from FIG. 6B, with respect to the TiN layer, even when the projecting height of the ring 8 is zero or when the ring 8 is not projected above the upper surface of the lower electrode 3, the uniform etching rate can be obtained. As the ring 8 is raised above the upper surface of the lower electrode 3, the etching rate in the periphery portion of the semiconductor wafer W is decreased with the result of the deteriorated uniformity.

Accordingly, for instance when laminated layers including Al—Si—Cu alloy layers and TiN layers is to be etched, it is preferable that the Al—Si—Cu alloy layers are etched with the ring 8 being raised above the lower electrode 3 by 40 millimeters whereas the TiN layers are etched with the ring 8 not projected above the lower electrode 3. Thus, the uniform etching can be carried out for both the Al—Si—Cu alloy layers and the TiN layers and hence the entire laminated structure including the Al—Si—Cu alloy layers and the TiN layers can be uniformly etched.

Figure 7A:
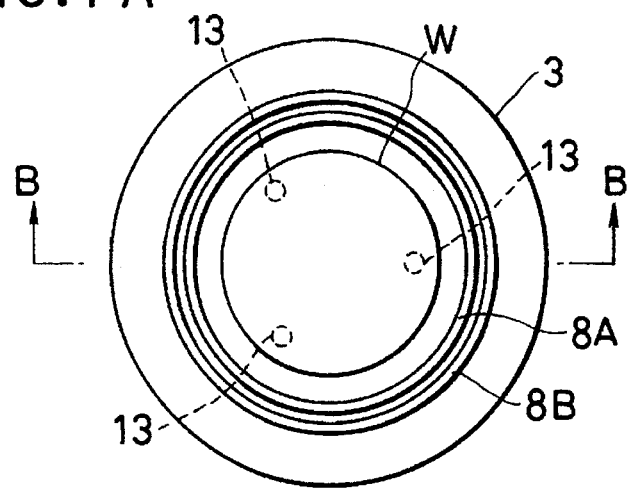
FIG. 7A is a plan view of a lower electrode used in the second embodiment.
Figure 7B:
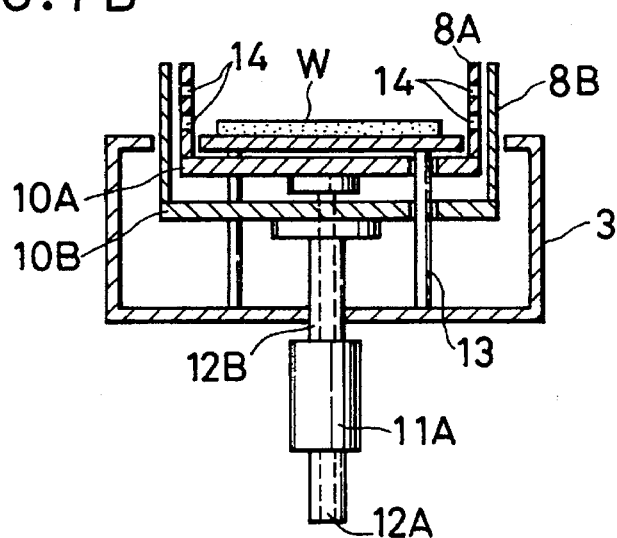
FIG. 7B is a cross-sectional view taken along the line B—B in FIG. 7A.

FIGS. 7A and 7B illustrates a lower electrode for use with a second embodiment in accordance with the invention. In the second embodiment, the apparatus for dry etching has a smaller diameter ring and a larger diameter ring. The combination of these two rings ensures more appropriate control of the discharge of gas and products of reaction.

As illustrated, a smaller diameter ring 8A is disposed around the wafer W and a larger diameter ring 8B is disposed around the smaller diameter ring 8A. The rings 8A and 8B are integrally formed with support plates 10A and 10B respectively to which is connected through coaxially disposed drive rods 12A and 12B a single mechanism 11A which raises and lowers the rings 8A and 8B independently. The mechanism 11A may comprise various known structure or structures such as an air cylinder unit or a stepping motor, as is easily understood to those skilled in the art.

The smaller diameter ring 8A is provided at a circumferential wall thereof with a plurality of openings 14. The openings 14 are disposed in two rows in a heightwise direction of the circumferential wall of the ring 8A and circumferentially equally spaced from each other. The openings 14 are disposed wholly over the circumferential wall of the ring 8A. However, it should be noted that the openings may be provided to the larger diameter ring 8B, and that openings 14 may be formed in a single row, unequally spaced from each other or partially formed over the circumferential wall of the ring.

It should be noted that parts in the second embodiment which correspond to those in the first embodiment have been provided with the same reference characters.

Figure 8A:
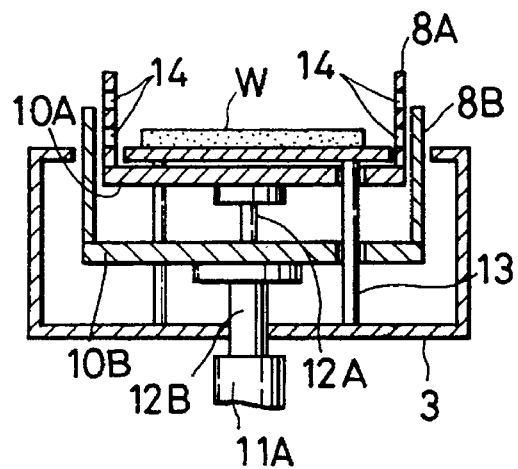
FIG. 8A is a cross-sectional view of a lower electrode and smaller and larger diameter rings in which the larger diameter ring is being raised.
Figure 8B:
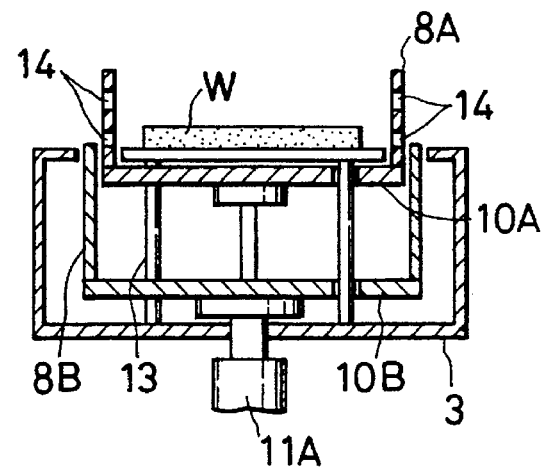
FIG. 8B is a cross-sectional view of a lower electrode and smaller and larger diameter rings in which the larger diameter ring is lowered to the bottom.

As illustrated in FIGS. 8A and 8B, in etching, while the smaller diameter ring 8A is kept in projecting above the upper surface of the lower electrode 3, the mechanism 11A is allowed to raise or lower the larger diameter ring 8B to thereby ensure successively vary the relationship between the two rings 8A and 8B. For instance, the larger diameter ring 8B may be kept below the upper surface of the lower electrode 3 as illustrated in FIG. 8B, and then only the smaller diameter ring 8A is used to control the discharge of gas and products of reaction. In this case, the openings 14 formed at the circumferential wall of the smaller diameter ring 8A can vary substantially an area of the circumferential wall to thereby enable to control the discharge on the semiconductor wafer W under a different condition from that of the first embodiment. In addition, by varying the projecting height of the larger diameter ring 8B, it is possible to control the distribution of the etching rate in the wafer W in a different fashion from that of the first embodiment. Thus, it is possible to enlarge an area in which the distribution of the etching rate can be compensated for different kinds of layers and/or changes of etching conditions.

Figure 9A:
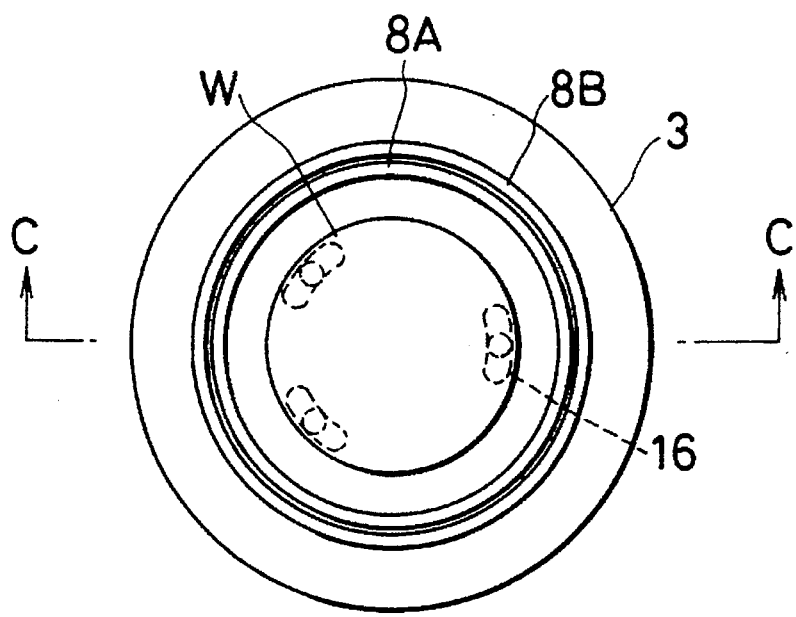
FIG. 9A is a plan view of a lower electrode used in the third embodiment.
Figure 9B:
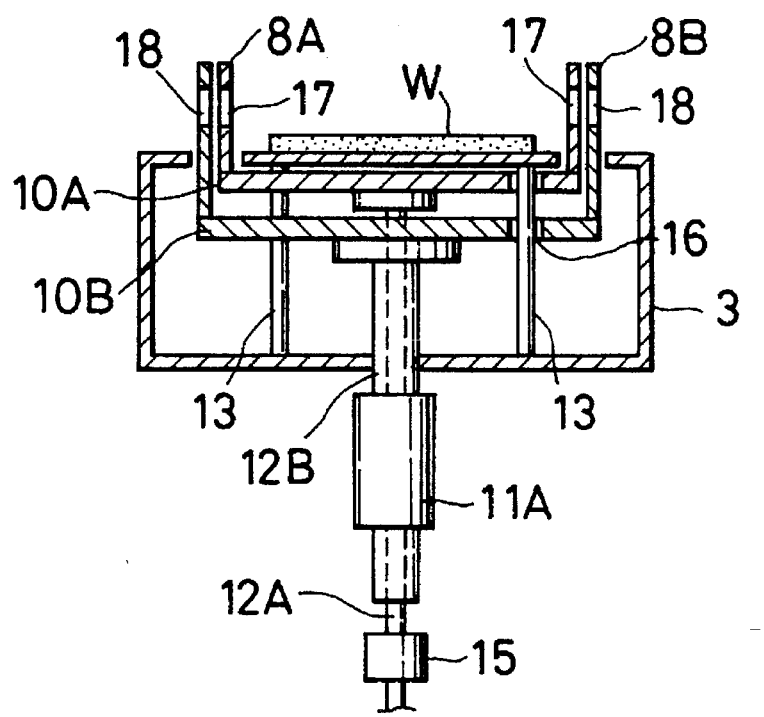
FIG. 9B is a cross-sectional view taken along the line C—C in FIG. 9A.

FIGS. 9A and 9B illustrate a lower electrode for use with a third embodiment. In the third embodiment, similarly to the second embodiment, the apparatus for dry etching has the smaller diameter ring 8A and the larger diameter ring 8B both of which are connected to the mechanism 11A for raising and lowering the rings 8A and 8B. The third embodiment is characterized by that the smaller diameter ring 8A is adapted to rotate around an axis of the drive rod 12A by means of a stepping motor 15. As illustrated in FIG. 9A, the circular plate 10A is provided with arc-shaped slits 16 through which the supports rods 13 pass. The arc-shaped slits 16 ensure that the smaller diameter ring 8A rotates within an angle defined by the arc.

It should be noted that, though the smaller diameter ring 8A is adapted to rotate in the third embodiment, the larger diameter ring 8B may be adapted to rotate in place of the smaller diameter ring 8B or both the rings 8A and 8B may be adapted to rotate in the same direction or an opposite direction.

Figure 10:
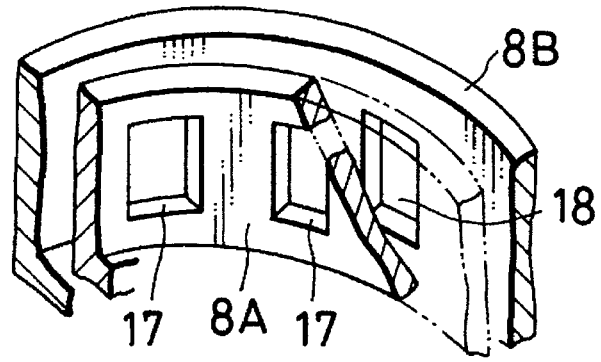
FIG. 10 is an enlarged perspective view illustrating slits formed at circumferential walls of the smaller and larger diameter rings.

As illustrated in FIG. 10, the smaller and larger diameter rings 8A and 8B are circumferentially provided with a plurality of slits 17 and 18 each equally spaced from each other.

Figure 11A:
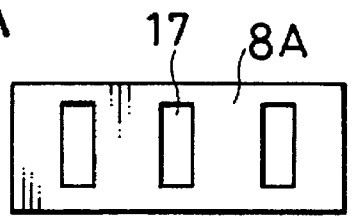
FIGS. 11A, 11B and 11C illustrates various overlapping degrees of the slits of the smaller and larger diameter rings.
Figure 11B:
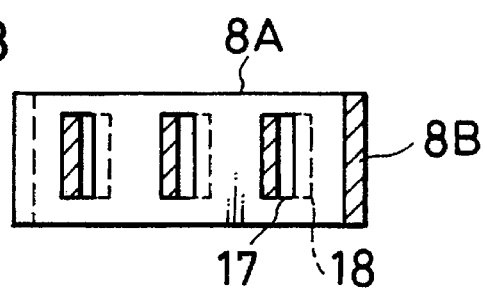
Figure 11C:
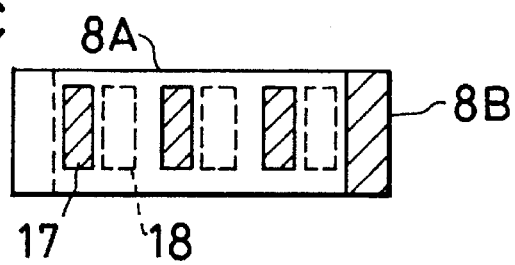

Thus, the smaller diameter ring 8A and the larger diameter ring 8B may be raised or lowered independently of each other, and accordingly it is possible to carry out substantially the same control of the discharge as that of the second embodiment. In addition, since the smaller diameter ring 8A is rotated by the stepping motor 15, the ring 8A can be rotated by a desired rotation angle. Thus, by rotating the smaller diameter ring 8A by a small angle, the relative positional relationship between the rings 8A and 8B can be varied to thereby enable to control degree of overlap of the slits 17 and 18, as illustrated in FIGS. 11A, 11B and 11C. FIG. 11A illustrates that the slits 17 of the smaller diameter ring 8A entirely overlaps the slits 18 of the larger diameter ring 8B to thereby form a full open state, FIG. 11B illustrates that the slits 17 partially overlaps the slits 18 to thereby form a partial open state, and FIG. 11C illustrates that the slits 17 do not overlap the slits 18 at all to thereby form a closing state of slits.

Thus, it is possible to successively vary a substantial opening area formed in accordance with the overlapping degree of the rings 8A and 8B, to thereby make it possible to further enlarge an area, relative to the second embodiment, in which the distribution of the etching rate can be compensated for different kinds of layers and/or changes of etching conditions.

It should be noted that the slits 17 and 18 may have a triangular or circular shape or other suitable shapes. By forming the slits 17 and 18 in other shape than a rectangle as illustrated in FIG. 10, it is possible to vary a rate of change of the opening area in the circumferential walls of the rings 8A and 8B relative to rotation angles of the smaller diameter ring 8A, to thereby enable to control the etching process under different conditions.

There are many arrangements in the formation of the slits 17 and 18. For instance, the slits 17 and 18 may be circumferentially equally spaced from each other. The spacing between the adjacent slits 17 may be equal to or different from the spacing between the adjacent slits 18. In FIGS. 9A, 9B and 10, the slits 17 and 18 are formed in a single row, however, the slits 17 and 18 may be formed in two or more rows disposed in a heightwise direction of the circumferential walls of the rings 8A and 8B. In addition, the slits 17 and 18 may be formed wholly or partially along the circumferential walls of the rings 8A and 8B.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. An apparatus for dry etching comprising:
   a vacuum chamber into which an etching gas is to be introduced;
   an electrode disposed in said vacuum chamber, said electrode having an upper surface for supporting a material to be etched;
   a smaller diameter cylindrical ring disposed around said electrode;
   a larger diameter cylindrical ring disposed around said smaller diameter cylindrical ring; and
   means for independently raising said smaller and larger diameter rings above said upper surface of said electrode and for independently lowering said smaller and larger diameter rings below said upper surface of said electrode.

2. An apparatus for dry etching in accordance with claim 1, wherein said means for raising and lowering said smaller and larger diameter rings comprises:
   support rods for supporting a central circular portion of said upper surface of said electrode, said central circular portion being defined by a circular slit through which said smaller and larger diameter rings is to be raised above and lowered below said upper surface of said electrode, said material to be etched being disposed on said central circular portion;
   first means connected to a first circular plate at a lower surface of said smaller diameter ring for moving said smaller diameter ring upward and downward, a bottom surface of said first circular plate being provided with holes through which said support rods pass; and
   second means connected to a second circular plate at a lower surface of said larger diameter ring for moving said larger diameter ring upward and downward, a bottom surface of said second circular plate being provided with holes through which said support rods pass, said first means and second means being coaxially disposed.

3. An apparatus for dry etching in accordance with claim 1, wherein said material to be etched comprises a semiconductor wafer, said upper surface of said electrode being dimensioned so as to accommodate said semiconductor wafer.

4. An apparatus for dry etching in accordance with claim 1, wherein said smaller diameter ring is provided at a circumferential wall thereof with a plurality of openings.

5. An apparatus for dry etching in accordance with claim 4, wherein said openings are equally spaced from each other.

6. An apparatus for dry etching in accordance with claim 4, wherein said openings are disposed wholly on said circumferential wall.

7. An apparatus for dry etching in accordance with claim 4, wherein said openings are disposed in a plurality of rows along a heightwise direction of said circumferential wall.

8. An apparatus for dry etching in accordance with claim 7, wherein said rows of openings are equally spaced from each other.

9. An apparatus for dry etching in accordance with claim 7, wherein said rows of openings are disposed wholly on said circumferential wall.

10. An apparatus for dry etching comprising:

a vacuum chamber into which an etching gas is to be introduced;

an electrode disposed in said vacuum chamber, said electrode having an upper surface for supporting a material to be etched;

a smaller diameter cylindrical ring disposed around said electrode;

a larger diameter cylindrical ring disposed around said smaller diameter cylindrical ring; and means for rotating at least one of said smaller and larger diameter rings relative to the other, said smaller and larger diameter rings each being provided at a circumferential wall thereof with a slit, said slits overlapping each other when at least one of said rings is rotated relative to the other.

11. An apparatus for dry etching in accordance with claim 10 further comprising means for raising and lowering said smaller and larger diameter rings so that said rings are independently raised above or lowered below said upper surface of said electrode.

12. An apparatus for dry etching in accordance with claim 11, wherein said means for raising and lowering said smaller and larger diameter rings comprising:

support rods for supporting a central circular portion of said upper surface of said electrode, said central circular portion being defined by a circular slit through which said smaller and larger diameter rings are to be raised above and lowered below said upper surface of said electrode, said material to be etched being disposed on said central circular portion;

first means connected to a first circular plate at a lower surface of said smaller diameter ring for moving said smaller diameter ring upward and downward, a bottom surface of said first circular plate being provided with holes through which said support rods pass; and second means connected to a second circular plate at a lower surface of said larger diameter ring for moving said larger diameter ring upward and downward, a bottom surface of said second circular plate being provided with holes through which said support rods pass, said first means and second means being coaxially disposed.

13. An apparatus for dry etching in accordance with claim 10 wherein said means for rotating at least one of said rings relative to the other includes means for controlling a rotation angle of said means to vary a degree of overlap of said slits of said smaller and larger diameter rings.

14. An apparatus for dry etching in accordance with claim 13, wherein said means for rotating at least one of said rings relative to the other comprises a stepping motor.

15. An apparatus for dry etching in accordance with claim 10, wherein said means for rotating at least one of said smaller and larger diameter rings relative to the other includes:

support rods for supporting a central circular portion of said upper surface of said electrode, said central circular portion being defined by a circular slit along which said smaller and larger diameter rings are to be rotated, said material to be etched being disposed on said central circular portion; and first means connected to a lower surface of said smaller diameter ring for rotating said smaller diameter ring, a bottom surface of said smaller diameter ring being provided with arc-shaped opening through which said support rods pass, whereby only said smaller diameter ring is rotatable relative to said larger diameter ring, said larger diameter ring being unrotated.

16. An apparatus for dry etching in accordance with claim 15 further comprising second means connected to a lower surface of said larger diameter ring for rotating said larger diameter ring, a bottom surface of said larger diameter ring being provided with arc-shaped openings through which said support rods pass, said second means being disposed coaxially with said first means, whereby both said smaller and larger diameter rings are rotatable relative to each other.

17. An apparatus for dry etching in accordance with claim 10, wherein said smaller and larger diameter rings are provided with a plurality of slits, said slits being circumferentially equally spaced from each other.

18. An apparatus for dry etching in accordance with claim 17, wherein said slits are disposed wholly on said circumferential wall.

19. An apparatus for dry etching in accordance with claim 10, wherein said smaller and larger diameter rings are provided with a plurality of slits, said slits being disposed in a plurality of rows in a heightwise direction of said circumferential wall.

20. An apparatus for dry etching in accordance with claim 10, wherein said slit has a shape of a rectangle, circle or triangle.

* * * * *